(12) United States Patent
Hampo et al.

(10) Patent No.: US 11,324,148 B2
(45) Date of Patent: May 3, 2022

(54) COOLING SYSTEM FOR POWER MODULES

(71) Applicant: Delta Electronics, Inc., Taipei (TW)

(72) Inventors: Richard Hampo, Taipei (TW); Ajay Patwardhan, Taipei (TW)

(73) Assignee: DELTA ELECTRONICS, INC., Taipei (TW)

( * ) Notice: Subject to any disclaimer, the term of this patent is extended or adjusted under 35 U.S.C. 154(b) by 0 days.

(21) Appl. No.: 17/108,123

(22) Filed: Dec. 1, 2020

(65) Prior Publication Data

US 2021/0176901 A1 Jun. 10, 2021

Related U.S. Application Data

(60) Provisional application No. 62/944,697, filed on Dec. 6, 2019.

(51) Int. Cl.
*H05K 7/20* (2006.01)
*H05K 1/02* (2006.01)

(52) U.S. Cl.
CPC ....... *H05K 7/20927* (2013.01); *H05K 1/0209* (2013.01); *H05K 7/209* (2013.01)

(58) Field of Classification Search
None
See application file for complete search history.

(56) References Cited

U.S. PATENT DOCUMENTS

| | | | | |
|---|---|---|---|---|
| 4,912,600 A | * | 3/1990 | Jaeger | H01L 23/4735 165/104.33 |
| 5,121,290 A | * | 6/1992 | Azar | H05K 1/144 361/692 |
| 6,717,812 B1 | * | 4/2004 | Pinjala | H01L 23/473 165/80.4 |
| 7,301,772 B2 | * | 11/2007 | Tilton | H01L 23/4735 165/80.4 |
| 7,602,608 B2 | * | 10/2009 | Tilton | H01L 23/4735 174/15.1 |

(Continued)

FOREIGN PATENT DOCUMENTS

| | | |
|---|---|---|
| CN | 106783766 A | 5/2017 |
| CN | 206412334 U | 8/2017 |

(Continued)

*Primary Examiner* — Courtney L Smith
(74) *Attorney, Agent, or Firm* — Kirton McConkie; Evan R. Witt

(57) ABSTRACT

A cooling system for power modules is provided. The cooling system includes two covers, a plurality of power modules and a plurality of first spaces. The power modules are disposed between the two covers. Each power module includes a housing, a circuit board and heat dissipation elements disposed on the two sides of the circuit board. There is a through hole on the housing. Each first space is formed between two neighboring power modules or is formed between the cover and the neighboring power module. The heat dissipation elements of each power module are located in the neighboring first spaces, and the through hole of each power module is in communication with the neighboring first spaces. The first spaces and the through holes of the power modules are communicated with each other to form a coolant passageway collaboratively for allowing a coolant to pass through.

12 Claims, 14 Drawing Sheets

(56) References Cited

U.S. PATENT DOCUMENTS

| | | | | |
|---|---|---|---|---|
| 7,969,734 | B2* | 6/2011 | Arik | F28D 15/00 |
| | | | | 361/697 |
| 8,213,179 | B2* | 7/2012 | Yoshida | H05K 7/20927 |
| | | | | 361/699 |
| 8,363,403 | B2* | 1/2013 | Tonomoto | H01L 23/473 |
| | | | | 361/699 |
| 8,391,008 | B2* | 3/2013 | Dede | H01L 23/4735 |
| | | | | 361/702 |
| 9,072,197 | B2* | 6/2015 | Murata | H05K 7/20927 |
| 2006/0284308 | A1* | 12/2006 | Harada | H01L 23/4012 |
| | | | | 257/729 |
| 2007/0204646 | A1 | 9/2007 | Gagliano | |
| 2008/0239663 | A1* | 10/2008 | Yamamoto | H01L 23/473 |
| | | | | 361/691 |
| 2011/0316143 | A1 | 12/2011 | Noritake et al. | |
| 2012/0001341 | A1 | 1/2012 | Ide et al. | |
| 2019/0341327 | A1 | 11/2019 | Teysseyre et al. | |
| 2020/0042053 | A1* | 2/2020 | Cheng | G06F 1/20 |

FOREIGN PATENT DOCUMENTS

| | | |
|---|---|---|
| CN | 110112507 A | 8/2019 |
| DE | 102016223889 A1 | 6/2018 |
| EP | 1815514 A1 | 6/2006 |
| EP | 1790935 A2 | 5/2007 |

\* cited by examiner

COOLING SYSTEM FOR POWER MODULES

CROSS-REFERENCE TO RELATED APPLICATION

This application claims the benefit of U.S. Provisional Application No. 62/944,697 filed on Dec. 6, 2019, entitled "DOUBLE-SIDED DIRECT COOLING POWER MODULE". The entire contents of the above-mentioned patent applications are incorporated herein by reference for all purposes.

FIELD OF THE INVENTION

The present disclosure relates to a cooling system, and more particularly to a cooling system for power modules.

BACKGROUND OF THE INVENTION

Power modules for high power conversion typically require liquid coolant to have acceptable size and mass for on-board automotive use. As shown in FIG. 1, in the first generation designs, the power module is bolted to liquid-cooled heat sink, and the thermal interface material is utilized for transferring the heat from the power module to the heat sink. However, the thermal interface material is difficult to apply consistently and has high thermal resistance. Even more advanced designs have cooling surfaces on both sides of the power module (see FIG. 2), but to date these have only indirect cooling (requiring plural heat sinks and thermal interface material) and are very mechanically complex to assemble and guarantee lifetime performance.

Therefore, there is a need of providing a cooling system for power modules to obviate the drawbacks encountered from the prior arts.

SUMMARY OF THE INVENTION

It is an objective of the present disclosure to provide a cooling system for power modules. The structure of the power modules and covers of the cooling system forms the coolant passageway through overmolding, which reduces the external components.

In accordance with an aspect of the present disclosure, there is provided a cooling system for power modules. The cooling system includes two covers, a plurality of power modules and a plurality of first spaces. The plurality of power modules is disposed between the two covers and is arranged in sequence. Each of the plurality of power modules includes a housing, a circuit board and a plurality of heat dissipation elements. The circuit board is engaged in the housing. The plurality of heat dissipation elements is disposed on the two sides of the circuit board. There is a through hole on the housing. Each of the plurality of first spaces is formed between two neighboring power modules of the plurality of power modules or is formed between the cover and the neighboring power module. The plurality of heat dissipation elements of each of the plurality of power modules are located in the neighboring first spaces, and the through hole of each of the plurality of power modules is in communication with the neighboring first spaces. The plurality of first spaces and the through holes of the plurality of power modules are communicated with each other to form a coolant passageway collaboratively for allowing a coolant to pass through.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
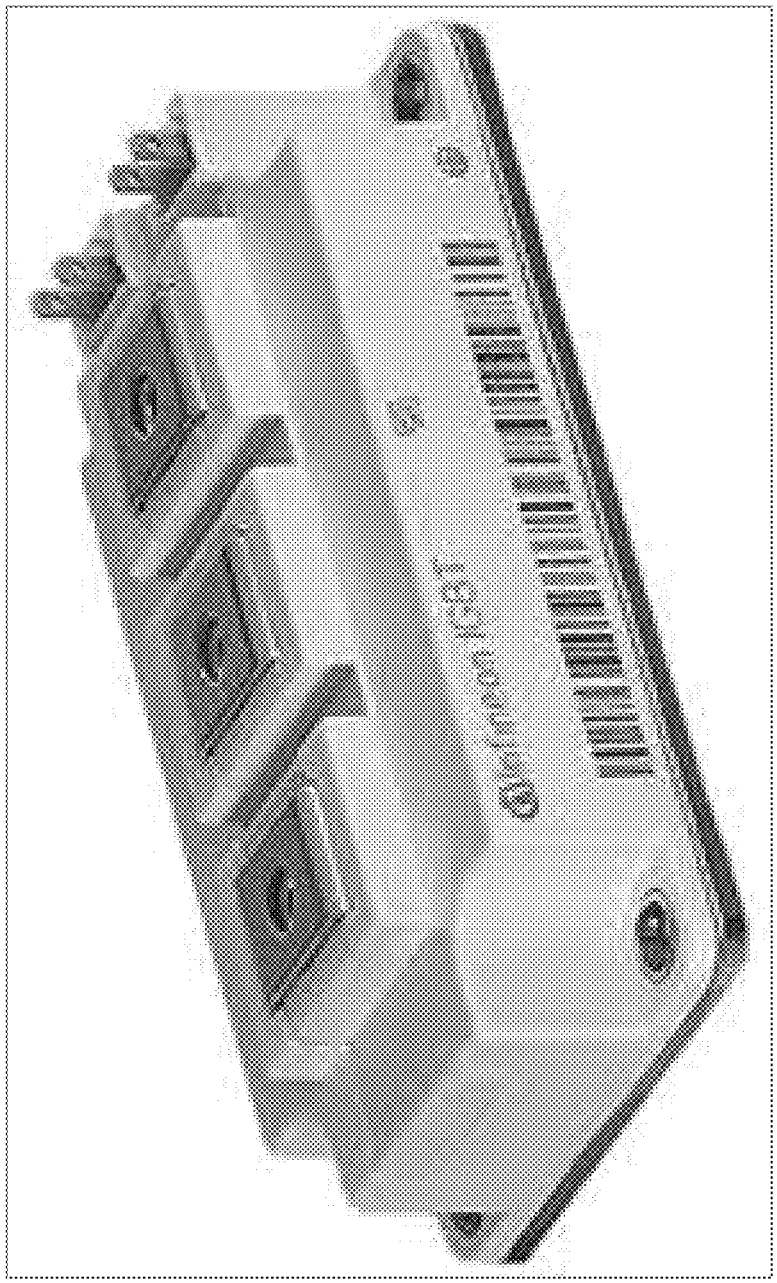
FIG. 1 is a schematic perspective view of a conventional gel-filled indirect cooling power module.
Figure 2:
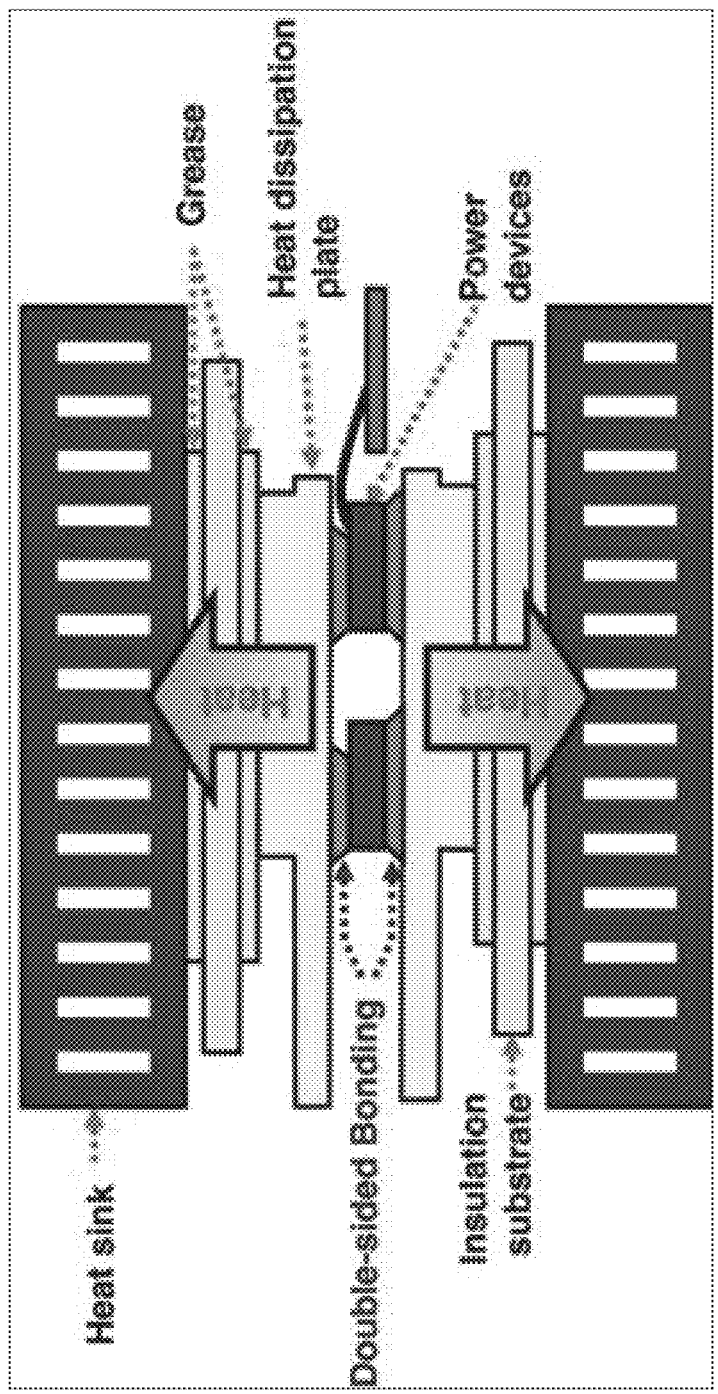
FIG. 2 is a schematic cross-sectional view of a conventional double-sided indirect cooling power module.
Figure 3:
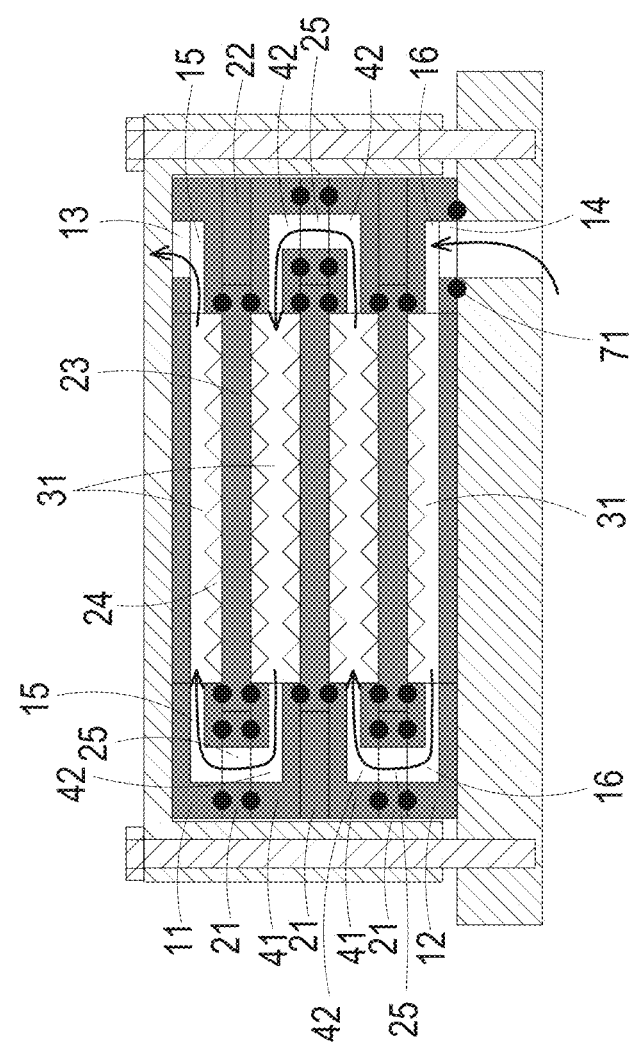
FIG. 3 is a schematic cross-sectional view of a cooling system for power modules according to an embodiment of the present disclosure.

FIG. 3 is a schematic cross-sectional view of a cooling system for power modules according to an embodiment of the present disclosure. As shown in FIG. 3, the cooling system 1 of the present disclosure includes two covers 11 and 12, a plurality of power modules 21 and a plurality of first spaces 31. The plurality of power modules 21 is disposed between the two covers 11 and 12 and is arranged in sequence. Each of the plurality of power modules 21 includes a housing 22, a circuit board 23 and a plurality of heat dissipation elements 24. The circuit board 23 is engaged in the housing 22. The plurality of heat dissipation elements 24 is disposed on the two sides of the circuit board 23. The plurality of heat dissipation elements 24 are for example but not limited to molded pin fins, forged pin fins, ribbon bonds, folded fins or lanced fins. There is a through hole 25 on the housing 22. Each of the plurality of first spaces 31 is formed between two neighboring power modules 21 of the plurality of power modules 21 or is formed between the cover 11 or 12 and the neighboring power module 21. The plurality of heat dissipation elements 24 of each of the plurality of power modules 21 are located in the neighboring first spaces 31, and the through hole 25 of each of the plurality of power modules 21 is in communication with the neighboring first spaces 31.

In this embodiment, the two covers are a top cover 11 and a bottom cover 12. The top and bottom covers 11 and 12 have a coolant outlet 13 and a coolant inlet 14 respectively. The coolant inlet 14 is in communication with the first space 31 formed between the bottom cover 12 and the neighboring power module 21, and the coolant inlet 14 is configured to introduce the coolant into the coolant passageway. The coolant outlet 13 is in communication with the first space 31 formed between the top cover 11 and the neighboring power module 21, and the coolant outlet 13 is configured to release the coolant from the coolant passageway. The top cover 11 has channels 15 for communicating the coolant outlet 13, the neighboring first space 31 and the through hole 25 of the neighboring power module 21 with each other. The bottom cover 12 has channels 16 for communicating the coolant inlet 14, the neighboring first space 31 and the through hole 25 of the neighboring power module 21 with each other. Accordingly, the coolant is introduced into the coolant passageway within the cooling system 1 through the coolant inlet 14, then the coolant flows through the plurality of first spaces 31 along the coolant passageway so as to dissipate the heat generated by the power modules 21, and finally the coolant is released to a space outside the cooling system 1 through the coolant outlet 13. The flowing path of the coolant is depicted by arrows. Of course, the flowing path of coolant shown in figures of the present disclosure can be reversed, and accordingly the coolant inlet 14 and the coolant outlet 13 are exchanged.

In the cooling system 1 of the present disclosure, the through holes 25 of the power modules 21, the first spaces 31, the coolant inlet 14 and the coolant outlet 13 can be formed through overmolding. In other words, the structure of the power modules 21 and covers 11 and 12 of the cooling system 1 forms the coolant passageway through overmolding, which reduces the external components.

Figure 4:
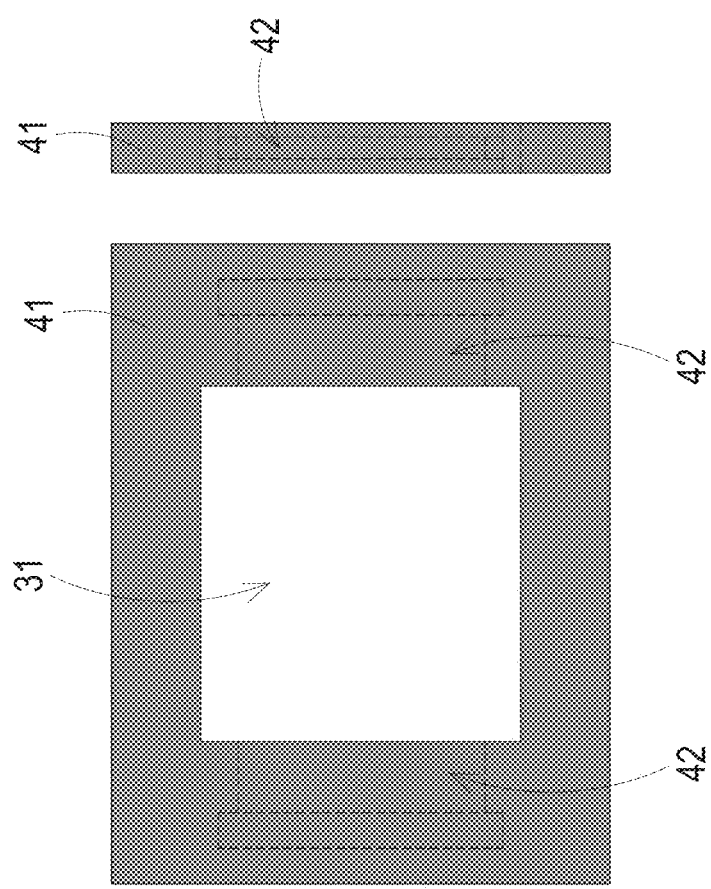
FIG. 4 schematically shows the top and side views of the spacer of FIG. 3.

In the embodiment shown in FIG. 3, the cooling system 1 further includes plural spacers 41. FIG. 4 schematically shows the top and side views of the spacer of FIG. 3. Please refer to FIG. 3 and FIG. 4. There is one spacer 41 between any two neighboring power modules 21, and thus the number of the spacers 41 is less than the number of the power modules 21 by one. The first space 31 is located in the middle of the spacer 41. Each spacer 41 includes two second spaces 42 in communication with the first space 31 therein, and the two second spaces 42 are in communication with the two through holes 25 of the two neighboring power modules 21 respectively. It is noted that each power module 21 or spacer 41 is flipped over along an axis by 180 degrees relative to the neighboring power module 21 or space 41, and the axis is a normal line to the cross section shown in FIG. 3.

Figure 5:
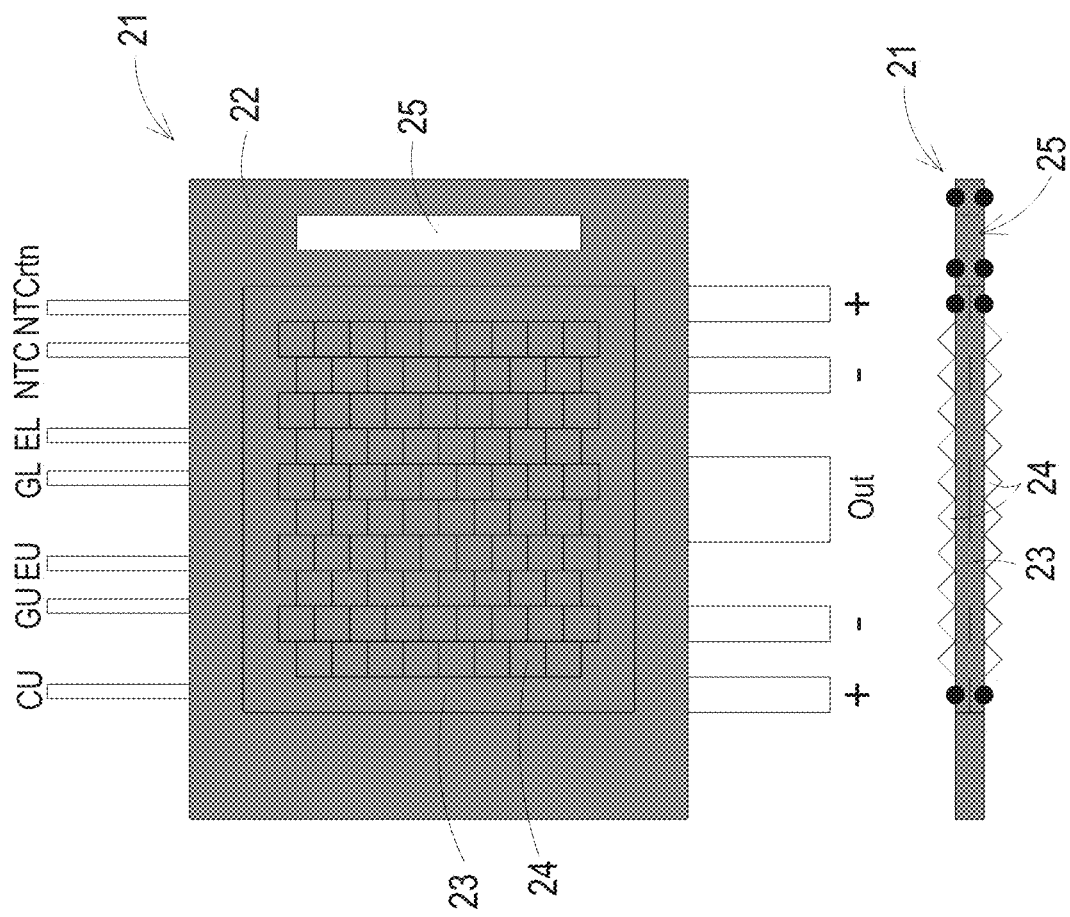
FIG. 5 schematically shows the top and side views of the power module of FIG. 3.

FIG. 5 schematically shows the top and side views of the power module of FIG. 3. As shown in FIG. 5, the power module 21 includes power terminals, which are designated as +, − and Out, and the power terminals are symmetrically disposed. Therefore, even if the power module 21 is flipped over along the said axis by 180 degrees, the arrangement of the power terminals is the same. In addition, the pins of the power module 21, such as CU, GU, EU, GL, EL, NTC and NTC rtn, can be varied according to actual requirements.

Figure 6:
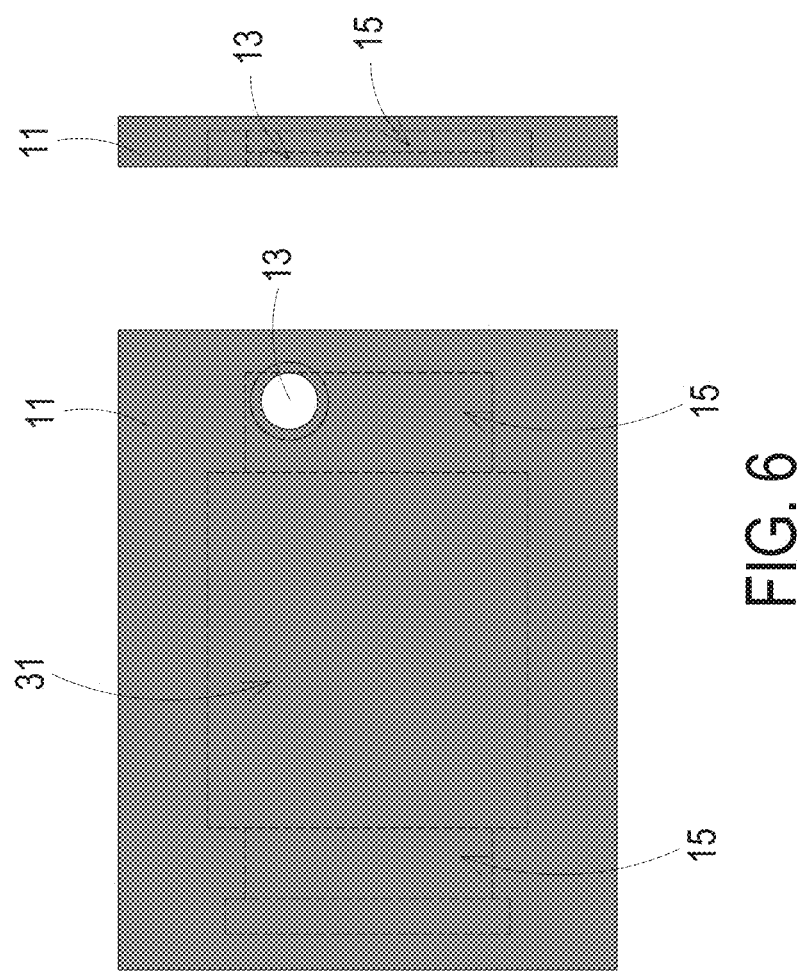
FIG. 6 schematically shows the top and side views of the top cover of FIG. 3.
Figure 7:
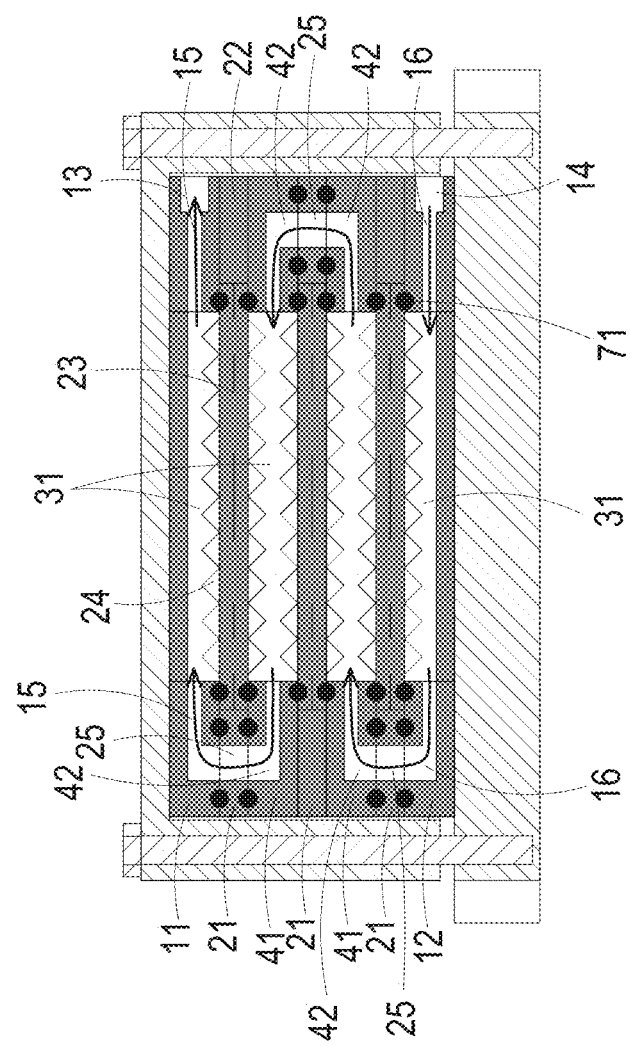
FIG. 7 schematically shows a variant of the cooling system for power modules of FIG. 3.
Figure 8:
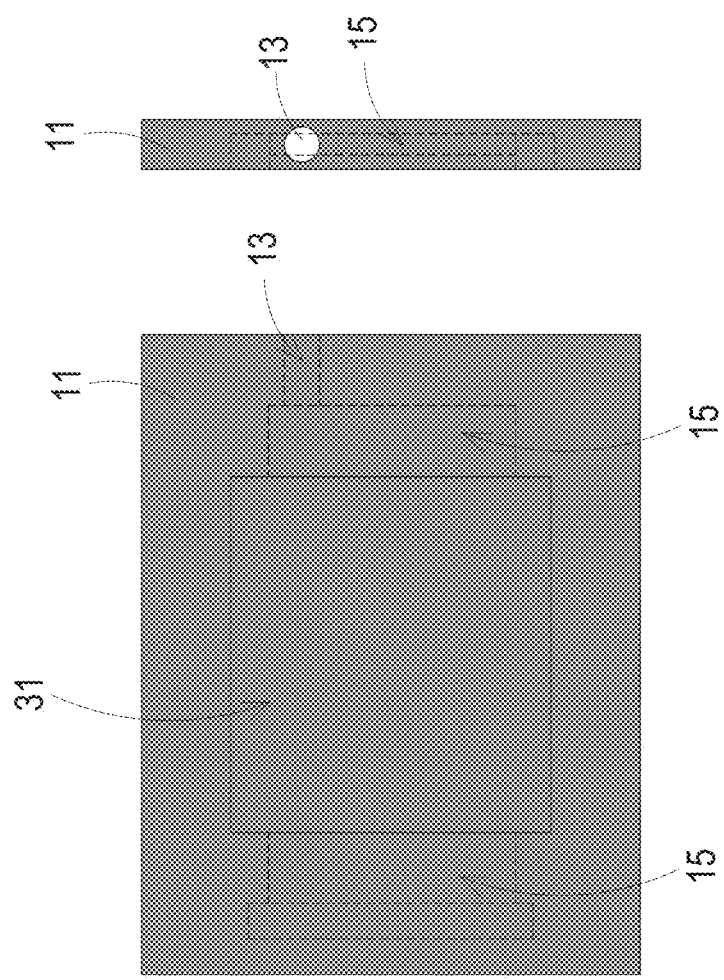
FIG. 8 schematically shows the top and side views of the top cover of FIG. 7.

FIG. 6 schematically shows the top and side views of the top cover of FIG. 3. Please refer to FIG. 3 and FIG. 6. In this embodiment, the coolant outlet 13 is formed on a surface, which is parallel to the power module 21, of the top cover 11. Since the top and bottom covers 11 and 12 are flipped over along the said axis by 180 degrees relative to each other and have the same structure, the coolant inlet 14 is formed on a surface, which is parallel to the power module 21, of the bottom cover 12. However, the location of the coolant inlet 14 and the coolant outlet 13 is not limited thereto. In an embodiment, as shown in FIG. 7 and FIG. 8, the coolant outlet 13 may be formed on a surface, which is perpendicular to the power module 21, of the top cover 11 (i.e., the side surface of the top cover 11). The coolant inlet 14 may be formed on a surface, which is perpendicular to the power module 21, of the bottom cover 12 (i.e., the side surface of the bottom cover 12).

Figure 9:
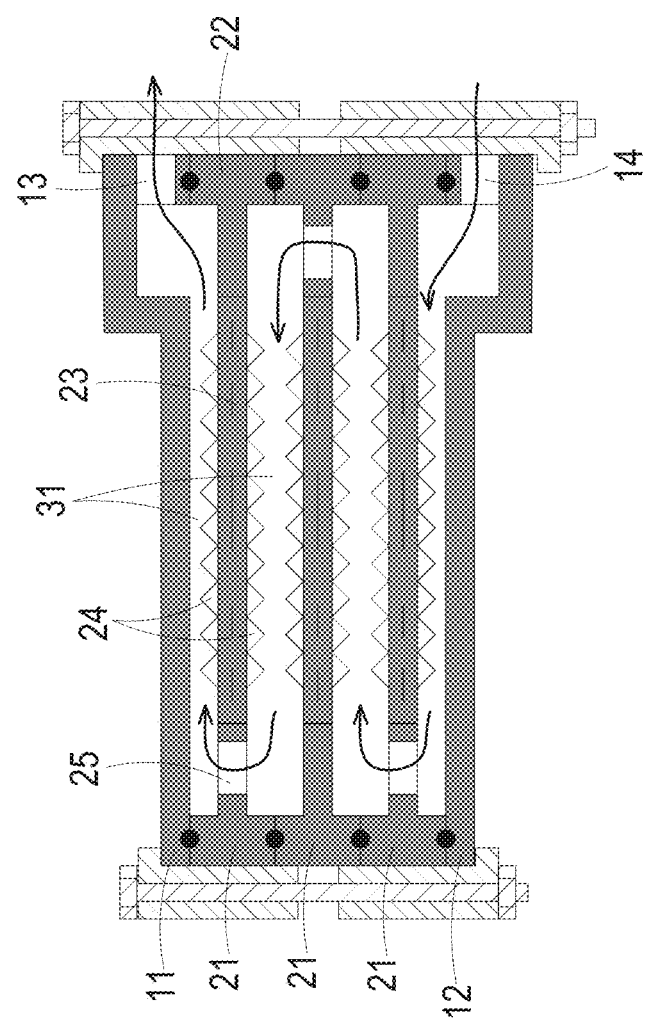
FIG. 9 and FIG. 10 schematically show variants of the cooling system for power modules of FIG. 3.
Figure 10:
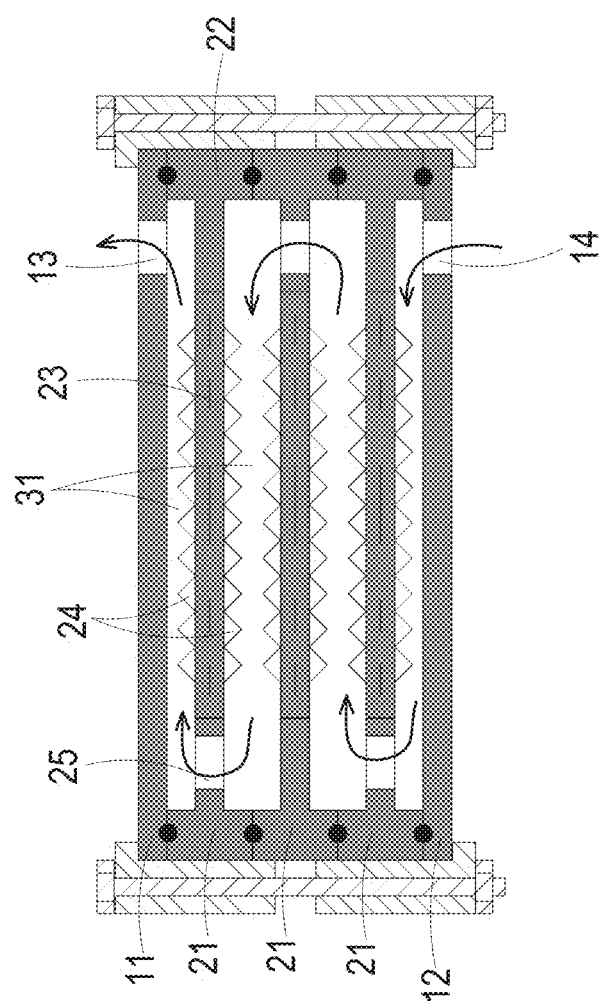

In an embodiment, as shown in FIG. 9, the spacer 41 in the embodiment of FIG. 3 may be left out, and there is no need to dispose channels in the top and bottom covers 11 and 12. In order to form the first spaces 31 while stacking the power modules 21, the periphery of the housing 22 of the power module 21 is protruded. In FIG. 9, the coolant inlet 14 and coolant outlet 13 are formed on the surfaces perpendicular to the power module 21. The coolant inlet 14 and coolant outlet 13 may be formed on the surfaces parallel to the power module 21 in another embodiment, as shown in FIG. 10.

Figure 11:
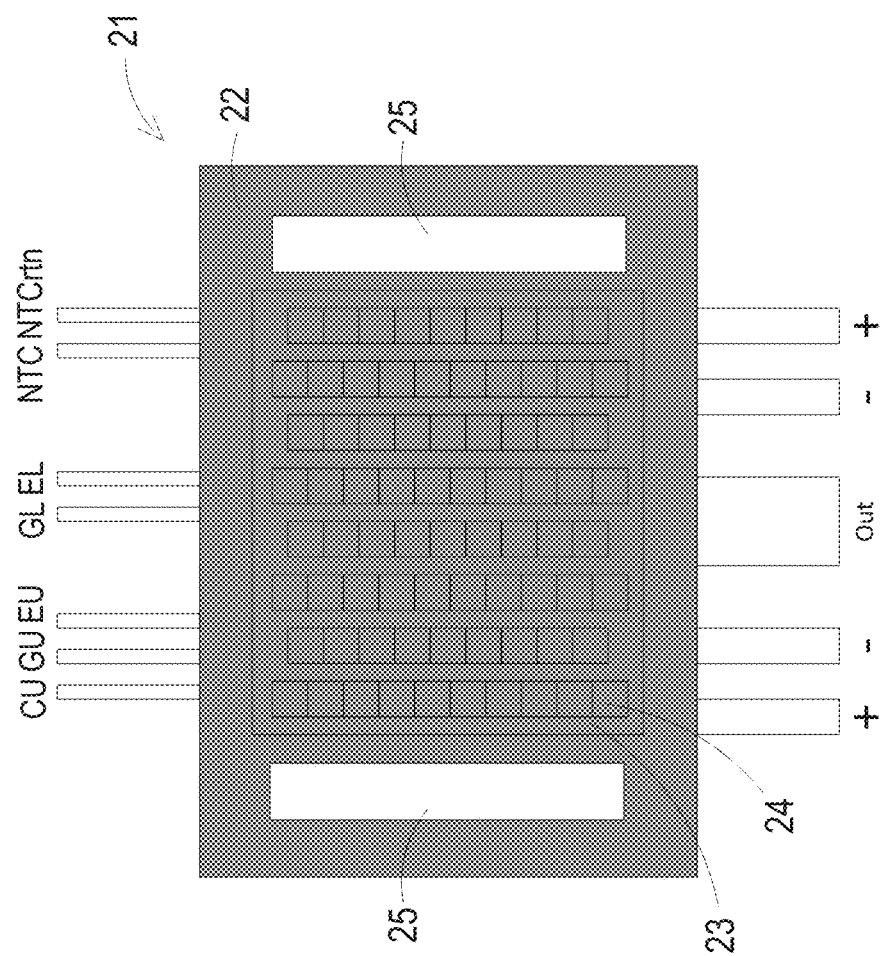
FIG. 11 schematically shows a variant of the power module of the present disclosure.
Figure 12:
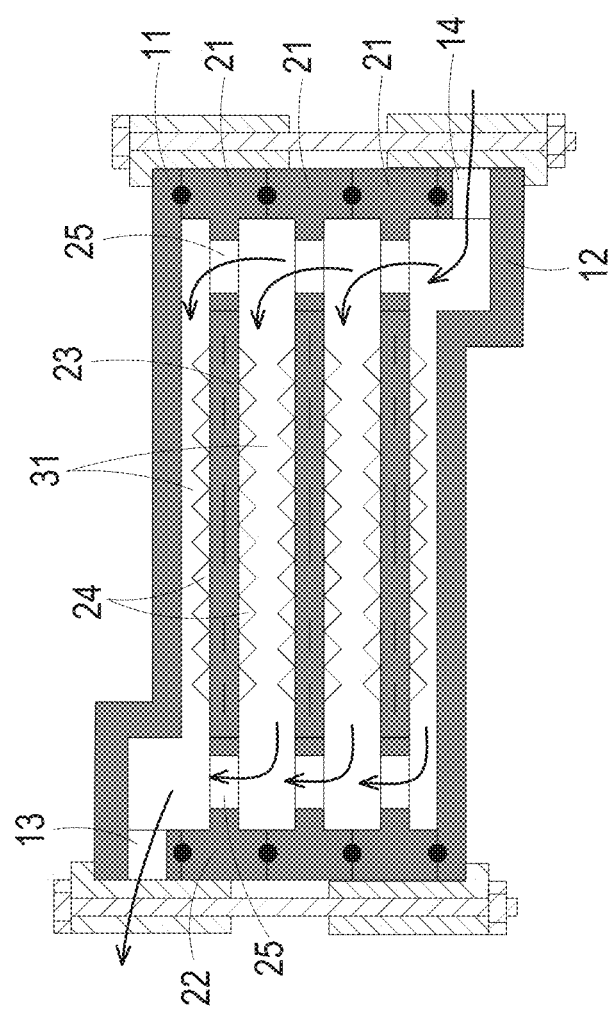
FIG. 12 and FIG. 13 schematically show variants of the cooling systems for power modules of FIG. 9 and FIG. 10 respectively, wherein the power module of FIG. 11 is applied in the cooling system.
Figure 13:
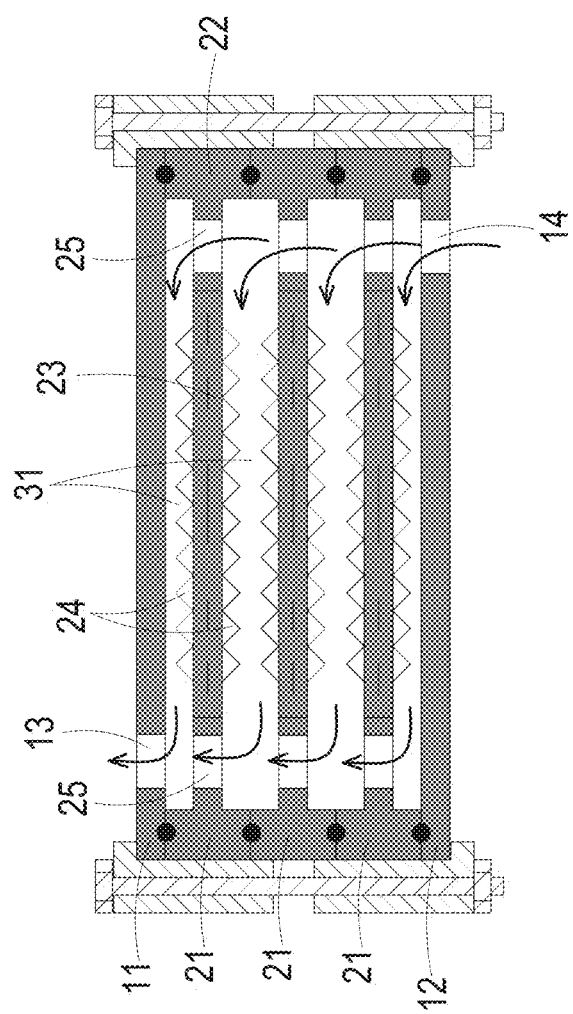

In addition, the number of the through hole 25 on the housing 22 of the power module 21 is not limited. For example, as shown in FIG. 11, there may be two through holes 25 on the housing 22 of the power module 21, and the two through holes 25 are located at the two sides of the circuit board 23 and are in communication with the neighboring first spaces 31. The corresponding cooling system is shown in FIG. 12 and FIG. 13. FIG. 12 and FIG. 13 represent the implementation of the coolant inlet 14 and coolant outlet 13 being formed on the surface perpendicular to the power module 21 and the surface parallel to the power module 21 respectively.

Figure 14:
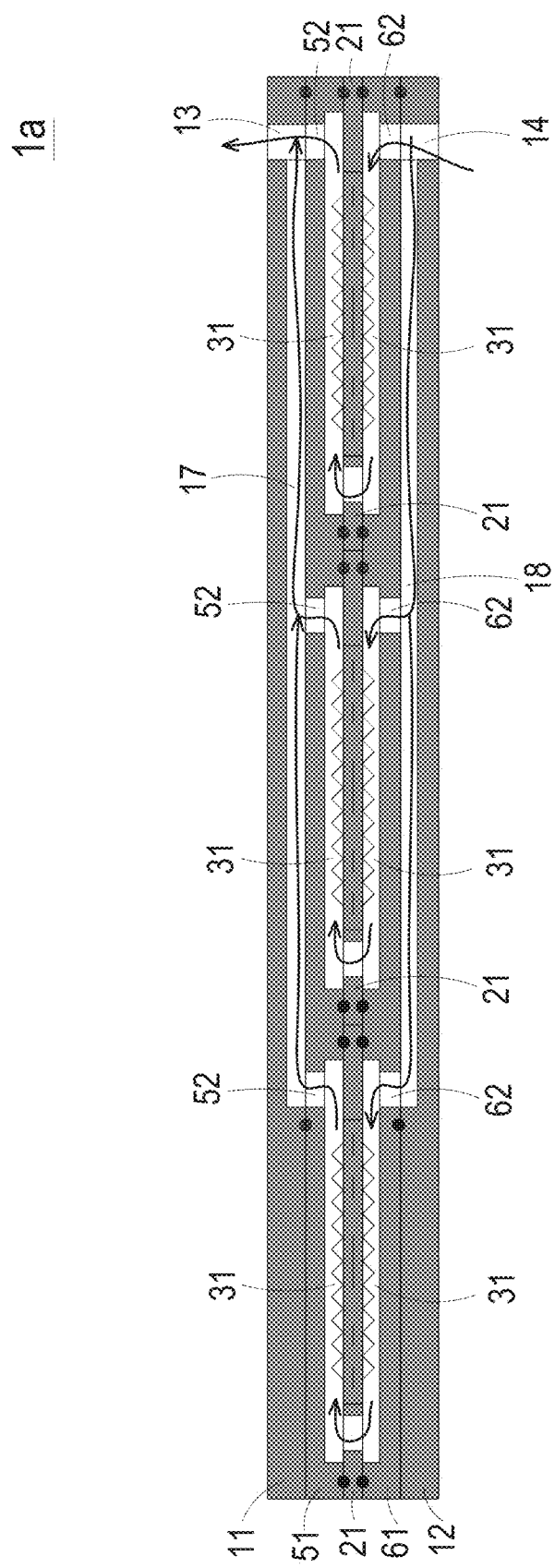
FIG. 14 is a schematic cross-sectional view of a cooling system for power modules according to another embodiment of the present disclosure.

In the present application, the centers of the two covers 11 and 12 are both located on a first direction D1. Further, in above embodiments, the power modules 21 are disposed along the first direction D1 in sequence. However, the arrangement of the power modules 21 is not limited thereto. In an embodiment, as shown in FIG. 14, the power modules 21 may be disposed along a second direction D2 in sequence, and the second direction D2 is perpendicular to the first direction D1. In the embodiment shown in FIG. 14, the cooling system 1a includes a top cover 11, a bottom cover 12, a first spacer 51, a second spacer 61 and a plurality of power modules 21. The first spacer 51 is disposed between the top cover 11 and the plurality of power modules 21. The top cover 11 includes a third space 17 in communication with the coolant outlet 13. The first spacer 51 has a plurality of openings 52 corresponds to and communicates with the first spaces 31 formed between the top cover 11 and the plurality of power modules 21 respectively, and the plurality of openings 52 of the first spacer 51 is in communication with the third space 17. The second spacer 61 is disposed between the bottom cover 12 and the plurality of power modules 21. The bottom cover 12 includes a fourth space 18 in communication with the coolant inlet 14. The second spacer 61 has a plurality of openings 62 corresponds to and communicates with the first spaces 31 formed between the bottom cover 12 and the plurality of power modules 21 respectively, and the plurality of openings 62 of the second spacer 61 is in communication with the fourth space 18.

In an embodiment, as shown in FIG. 3, an O-ring 71 is disposed at the junction of two components assembled to each other for prevent the coolant from leaking. For example, the O-ring 71 may be disposed at the junction of the two neighboring power modules 21, the junction of the cover 11 or 12 and the neighboring power module 21, and the junction of the spacer 41, 51 or 61 and the neighboring power module 21.

From the above descriptions, the present disclosure provides a cooling system for power modules. The structure of the power modules and covers of the cooling system forms the coolant passageway through overmolding, which reduces the external components.

While the disclosure has been described in terms of what is presently considered to be the most practical and preferred embodiments, it is to be understood that the disclosure needs not be limited to the disclosed embodiment.

What is claimed is:

1. A cooling system for power modules, comprising:
   two covers;
   a plurality of power modules disposed between the two covers and arranged in a sequence, wherein each of the plurality of power modules comprises a housing, a circuit board and a plurality of heat dissipation elements, the circuit board is engaged in the housing, the plurality of heat dissipation elements are disposed on a first side and a second side of the circuit board, and there is a through hole on the housing; and
   a plurality of first spaces, wherein each of the plurality of first spaces is formed between two neighboring power modules of the plurality of power modules or is formed between the cover and the neighboring power modules, wherein the plurality of heat dissipation elements of each of the plurality of power modules are located in the neighboring first spaces, and the through hole of each of the plurality of power modules are in communication with the neighboring first spaces,
   wherein the plurality of first spaces and the through holes of the plurality of power modules are communicated with each other to form a coolant passageway collaboratively for allowing a coolant to pass through.

2. The cooling system according to claim 1, wherein the two covers are a top cover and a bottom cover, the top and bottom covers have a coolant outlet and a coolant inlet respectively, the coolant inlet is in communication with the first space formed between the bottom cover and the neighboring power modules and is configured to introduce the coolant into the coolant passageway, and the coolant outlet is in communication with the first space formed between the top cover and the neighboring power modules and is configured to release the coolant from the coolant passageway.

3. The cooling system according to claim 2, wherein centers of the two covers are both located on a first direction, and the plurality of power modules are disposed along the first direction in the sequence.

4. The cooling system according to claim 3, wherein there are two said through holes on the housing of each of the plurality of power modules, and the two said through holes are located at a third side and a fourth side of the circuit board and in communication with the neighboring first spaces.

5. The cooling system according to claim 3, wherein the coolant inlet is formed on a surface parallel to the power module or a surface perpendicular to the power module, and the coolant outlet is formed on a surface parallel to the power module or a surface perpendicular to the power module.

6. The cooling system according to claim 3, wherein there is a spacer between any two neighboring power modules of the plurality of power modules, the spacer comprises two second spaces in communication with the corresponding first space, and the two second spaces are in communication with the through holes of the two neighboring power modules respectively.

7. The cooling system according to claim 3, wherein the top cover has channels for communicating the coolant outlet, the neighboring first space and the through hole of the neighboring power module with each other, and the bottom cover has channels for communicating the coolant inlet, the neighboring first space and the through hole of the neighboring power module with each other.

8. The cooling system according to claim 2, wherein centers of the two covers are both located on a first direction, and the plurality of power modules are disposed along a second direction perpendicular to the first direction in the sequence.

9. The cooling system according to claim 8, further comprising a first spacer, wherein the first spacer is disposed between the top cover and the plurality of power modules, the top cover comprises a third space in communication with the coolant outlet, the first spacer has a plurality of openings corresponds to and communicates with the first spaces formed between the top cover and the plurality of power modules respectively, and the plurality of openings of the first spacer is in communication with the third space.

10. The cooling system according to claim 8, further comprising a spacer, wherein the spacer is disposed between the bottom cover and the plurality of power modules, the bottom cover comprises a fourth space in communication with the coolant inlet, the spacer has a plurality of openings corresponds to and communicates with the first spaces formed between the bottom cover and the plurality of power modules respectively, and the plurality of openings of the spacer is in communication with the fourth space.

11. The cooling system according to claim 1, wherein each of the plurality of power modules comprises power terminals which are symmetrically disposed.

12. The cooling system according to claim 1, wherein the plurality of heat dissipation elements are molded pin fins, forged pin fins, ribbon bonds, folded fins or lanced fins.

* * * * *